United States Patent [19]
Ota

[11] Patent Number: 5,533,153
[45] Date of Patent: Jul. 2, 1996

[54] OPTICAL RELAY AMPLIFIER WITH A BYPASS WAVEGUIDE

[75] Inventor: Takeshi Ota, Kanagawa, Japan

[73] Assignee: Fuji Xerox Co., Ltd., Tokyo, Japan

[21] Appl. No.: 425,071

[22] Filed: Apr. 19, 1995

[30]  Foreign Application Priority Data

May 27, 1994  [JP]  Japan .................................. 6-115186

[51] Int. Cl.⁶ .................................................... G02B 6/28
[52] U.S. Cl. ............................ 385/24; 359/179; 359/349; 385/45
[58] Field of Search .................................. 385/12–15, 24, 385/27, 39, 45; 359/127, 179, 341, 344, 349

[56]  References Cited

U.S. PATENT DOCUMENTS

| | | | |
|---|---|---|---|
| 4,909,585 | 3/1990 | Kobayashi et al. | 385/24 X |
| 5,170,447 | 12/1992 | Heidemann | 385/24 |
| 5,214,728 | 5/1993 | Shigematsu et al. | 385/24 |
| 5,233,463 | 8/1993 | Grasso et al. | 359/341 |
| 5,282,080 | 1/1994 | Scifres et al. | 359/344 |
| 5,416,865 | 5/1995 | Fielding | 385/15 X |

FOREIGN PATENT DOCUMENTS

| | | |
|---|---|---|
| 5-14285 | 1/1993 | Japan . |
| 5-7055 | 1/1993 | Japan . |

*Primary Examiner*—John D. Lee
*Attorney, Agent, or Firm*—Finnegan, Henderson, Farabow, Garrett & Dunner

[57]  ABSTRACT

In an optical relay amplifier of the present invention, an inputted signal optical is divided into a plurality of lights by the first optical coupler. One of the divided inputted signal lights is amplified by an optical amplifier, the other inputted signal light is made to pass through a bypass optical waveguide path provided. The amplified light from the optical amplifier is coupled with the light that has passed through the bypass optical waveguide path by a second optical coupler, and the optical amplifier is a semiconductor laser amplifier including a V-shaped optical waveguide path and two end portions connected with the optical waveguide paths of the first and second optical couplers. A reflecting surface is formed in a returning end portion of the V-shaped optical waveguide path.

19 Claims, 7 Drawing Sheets

OPTICAL RELAY AMPLIFIER WITH A BYPASS WAVEGUIDE

BACKGROUND OF THE INVENTION

1. Field of the Invention

The present invention relates to an optical relay amplifier primarily used for an optical communication network, and more particularly relates to a optical relay amplifier in which a semiconductor laser amplifier is used.

2. Description of the Conventional Art

In optical communication networks, optical signals are subjected to an optical relay amplification to compensate a loss of the intensity of the signals from attenuation and distribution of the signals. For example, in a bidirectional communication device in which star couplers are used, the patent of which was applied by the present applicant and disclosed in Japanese Unexamined Patent Publication No. 5-14285, an optical relay amplifier is provided between a plurality of star couplers to compensate the attenuation of the optical signals.

For example, Unexamined Japanese Patent Publication discloses that an optical relay amplifier is provided between a plurality of star couplers in order to compensate the attenuation of the optical signals in a bidirectional communication device using the star coupler.

FIG. 9 is a perspective view of the optical relay amplifier in which a semiconductor laser amplifier and a bypass optical waveguide path are combined, as disclosed in Unexamined Japanese Patent Publication No. 5-7055.

An optical signal input from the left of the drawing is divided by an optical coupler 35a. One of the divided optical signals passes through an optical waveguide path 36, semiconductor laser amplifier 34 and optical waveguide path 37, and then reaches an optical coupler 35b. The other of the divided optical signals passes through a bypass optical waveguide path 33, and reaches the optical coupler 35b. The optical signal that has passed through the semiconductor laser amplifier 34 is joined at the optical coupler 35b with the optical signal that has passed through the bypass optical waveguide path 33. Then the joined optical signal outputs from the optical coupler 35b to the right of the drawing. Since the semiconductor laser amplifier 34 is a bidirectional optical amplifier, an optical signal entering from the right of the drawing also passes through the same optical paths in the opposite direction and is amplified in the same manner. The bypass optical waveguide path 33 is provided for the purpose of fail-safe in the case of breakdown of the semiconductor laser amplifier 34. In this arrangement, cylindrical lenses 31a, 31b are provided for connecting the semiconductor laser amplifier 34 with the optical waveguide paths 36 and 37.

The following problems are caused in the optical relay amplifier shown in FIG. 9. In order to arrange the semiconductor laser amplifier 34 on the optical waveguide path substrate 32, it is necessary to form a cutout portion 38 thereon. Accordingly, it is difficult to manufacture the optical waveguide path base board 32. It is necessary to optically polish an end surface of the optical waveguide path substrate so that the end surface can be optically connected with other units. In the case of the apparatus shown in FIG. 9, it is necessary to optically polish four end surfaces of the optical waveguide path substrate. Further, it is difficult to accomplish an optical alignment between the optical waveguide paths 36, 37 and the semiconductor laser amplifier 34.

SUMMARY OF THE INVENTION

It is an object of the present invention to provide a optical relay amplifier in which a cutout portion is not required on the optical waveguide path circuit substrate.

An optical relay amplifier according to the present invention is comprised of a first optical coupler for dividing inputted signal light into a plurality of lights; a first optical amplifier which is a semiconductor laser amplifier for amplifying one signal light of the divided plurality of lights, the first optical amplifier including a V-shaped optical waveguide path having two ends and a returning end portion having a reflection surface, one end of the two ends being connected to the first optical coupler; a bypass optical waveguide path for passing remaining signal light of the divided plurality of lights therethrough; and a second optical coupler for coupling the amplified light from the first optical amplifier with the passing light from the bypass optical waveguide path, the other end of the two ends being connected to the second optical coupler.

When a V-shaped optical waveguide path is provided in the semiconductor laser amplifier, it is possible to arrange an input and an output port of the optical signal on the same end surface of the semiconductor laser amplifier. Therefore, it is unnecessary to form a cutout portion on the optical waveguide path circuit board.

BRIEF DESCRIPTION OF THE DRAWINGS

In the accompanying drawings.

PREFERRED EMBODIMENTS OF THE PRESENT INVENTION

The preferred embodiments of the present invention will be described as follows referring to the accompanying drawings.

Figure 1:
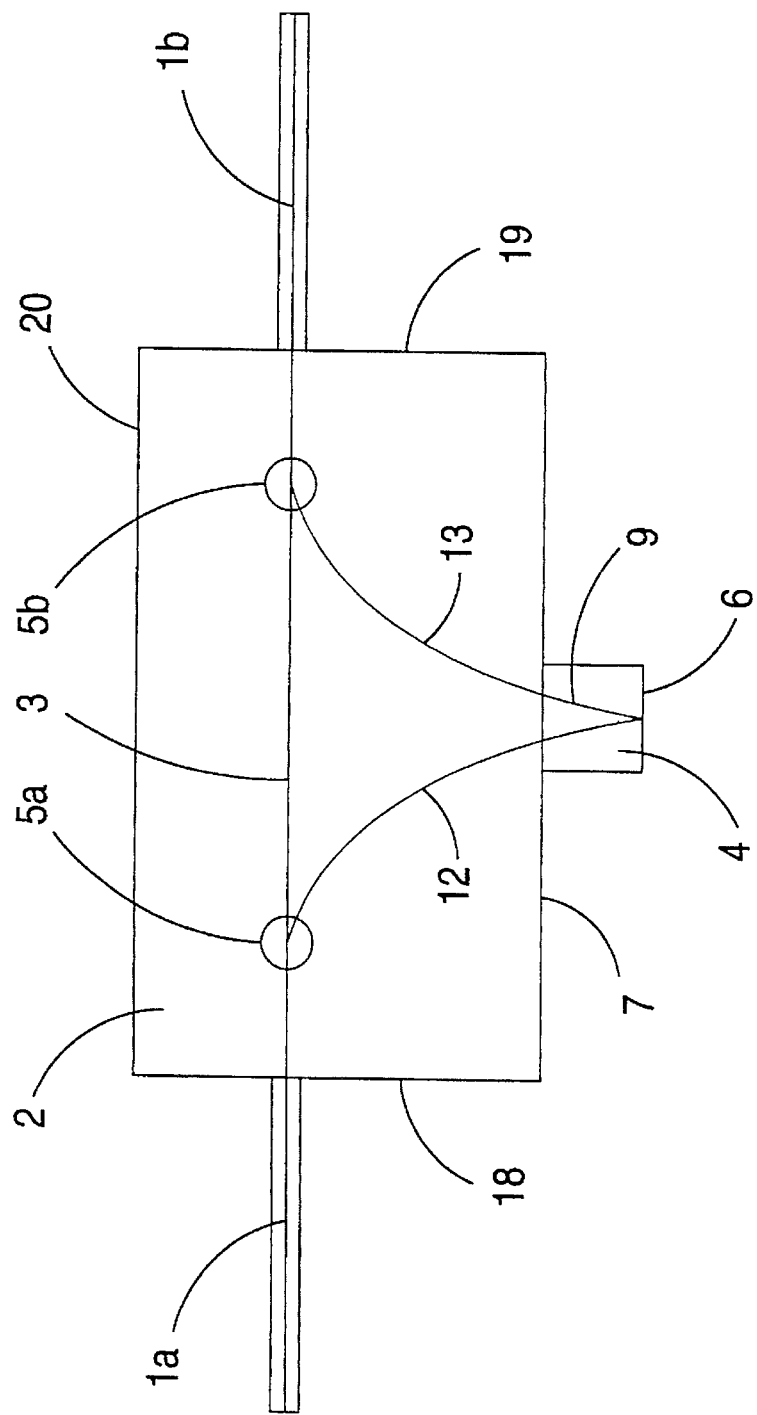
FIG. 1 is a plan view of a optical relay amplifier of a first embodiment of the present invention.

FIG. 1 is a plan view showing a first embodiment of an optical relay amplifier of the present invention. The semiconductor laser amplifier 4 is provided with a V-shaped optical waveguide path 9. An end surface 8 of a semiconductor laser amplifier 4 comes into contact with an end surface 7 of the optical waveguide path circuit board 2, so that both end surfaces are optically coupled. An input and an output optical fiber 1a, 1b are optically coupled with the optical waveguide path circuit substrate 2.

The entire configuration of the optical waveguide path circuit substrate 2 is rectangular. Therefore, the optical waveguide path circuit substrate 2 is provided with four end surfaces 7, 18, 19, 20. On the optical waveguide path circuit substrate 2, provided are a bypass optical waveguide path 2 which directly couples the optical fiber 1a with the optical fiber 1b, optical couplers 5a, 5b located at both ends of the bypass optical waveguide path respectively, and optical waveguide paths 12, 13 introduced from the optical couplers 5a, 5b to the end surface 7 of the optical waveguide path circuit substrate 2. An interval between the optical waveguide paths 12 and 13 on the end surface 7 is the same as that of the V-shaped optical waveguide path 9 on the end surface 8.

Figure 2:
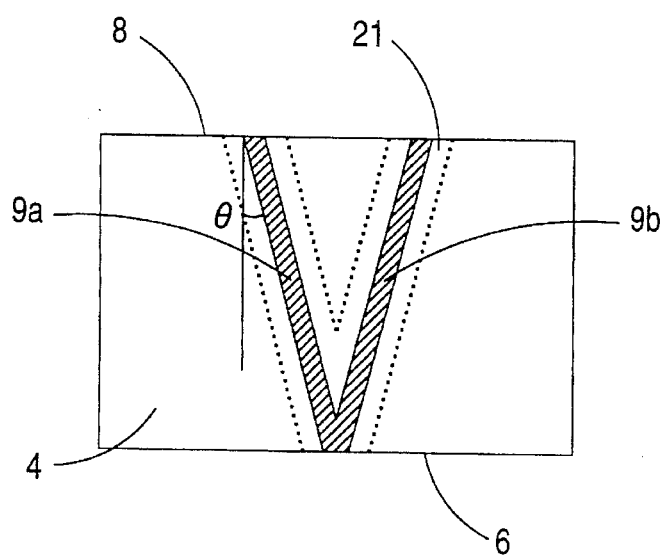
FIG. 2 is a plan view of the semiconductor laser beam amplifier.

FIG. 2 is a plan view of the semiconductor laser beam amplifier 4 used for the first embodiment of the present invention shown in FIG. 1. The semiconductor laser beam amplifier 4 is provided with V-shaped optical waveguide paths 9a, 9b which have two end portions between which an interval is formed and a returning end portion. One end surface 8 of the semiconductor laser beam amplifier 4 is coated with a reflection reducing optical coating (AR), and the other end surface 6 is coated with a highly reflecting coating (HR). A portion expressed by a broken line in FIG. 2 is an electrode 21 provided along the optical waveguide paths 9a, 9b. This electrode may be a rectangular solid electrode including both optical waveguide paths 9a and 9b. If necessary, the end surfaces 18, 19, 20 may be also coated with a reflection reducing optical coating (AR). The optical waveguide paths 9a, 9b are inclined by an angle q with respect to a straight line perpendicular to the end surface 8. Therefore, the residual reflectance on the end surface 8 can be reduced. The reason is that the light regularly reflected on the end surface 8 is not coupled with the optical waveguide path. In this connection, the above optical waveguide path is a single mode optical waveguide path, and the above optical fiber is a single mode optical fiber. A directional optical coupler is used for the above optical coupler.

An optical signal from the optical fiber 1a is divided by the optical coupler 5a into the bypass optical waveguide path 3 and the optical waveguide path 12. The optical signal that has passed through the optical waveguide path 12 passes through the optical waveguide path 9a on the semiconductor laser beam amplifier 4 and then is reflected on the end surface 6 of the semiconductor laser beam amplifier 4. Then the optical signal passes through the optical waveguide path 9b and is guided into the optical waveguide path 13. After the optical signal has passed through the optical waveguide path 13, it is joined by the optical coupler 5b to the optical signal from the bypassing optical waveguide path 3. Then the optical signal passes through the optical waveguide path 11 and is sent to the optical fiber 1b. An optical signal from the optical fiber 1b is transmitted to the optical fiber 1a through the same passage as described above in the opposite direction. Ratios of division of the optical couplers 5a, 5b are determined, for example, in such a manner that 90% are allotted to the side of the bypass optical waveguide path 3, and 10% are allotted to the side of optical waveguide path 12 or 13. The bypass optical waveguide path 3 is provided for the purpose of fail-safe in the case of breakdown of the semiconductor laser amplifier 4.

In the first embodiment shown in FIG. 1, although the optical fibers 1a, 1b are directly coupled with the optical waveguide path circuit substrate 2, they may be coupled with the optical waveguide path circuit substrate 2 through optical systems such as lenses. Also, the optical waveguide path circuit substrate 2 may be coupled with the semiconductor laser beam amplifier 4 through an optical system such as a lens. In this case, it is preferable to use an erect image formation optical system including a distributed refraction type rod lens. It should be noted that the present invention is not limited to the single mode optical waveguide path or optical fiber. However, with respect to the multi-mode optical waveguide path or optical fiber, it is appropriate to apply the fourth embodiment described later. For the optical couplers 5a, 5b, the optical coupler described in Japanese Patent Application Number Hei.4-334747 may be used. When the above optical coupler is used, it is possible to solve the problem of a loss caused when the optical signals are joined to each other in the directional coupler.

Figure 3:
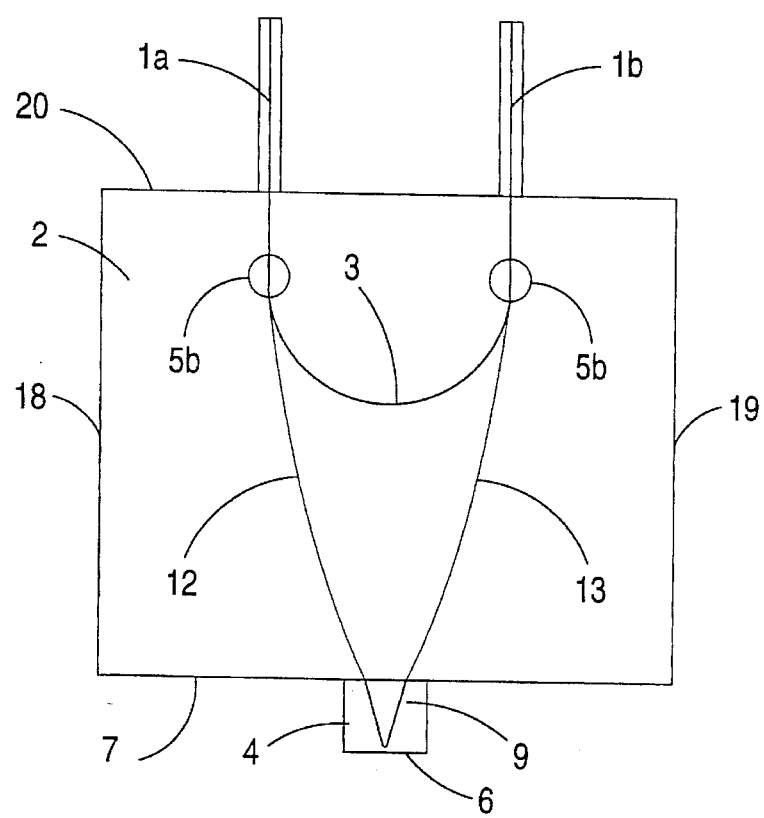
FIG. 3 is a plan view of the optical relay amplifier of a second embodiment of the present invention.

FIG. 3 is a plan view of a second embodiment of the optical relay amplifier of the present invention. The different point of the second embodiment from the first embodiment is that the optical waveguide path circuit on the optical waveguide path circuit substrate 2 is changed in such a manner that the optical fibers 1a, 1b are coupled with the end surface 20 on the optical waveguide path circuit substrate 2. Although, it is necessary to optically polish the three end surfaces 18, 19, 7 on the optical waveguide path circuit substrate 2 in the first embodiment, it is sufficient to optically polish only the two end surfaces 7, 20 in the second embodiment.

Figure 4:
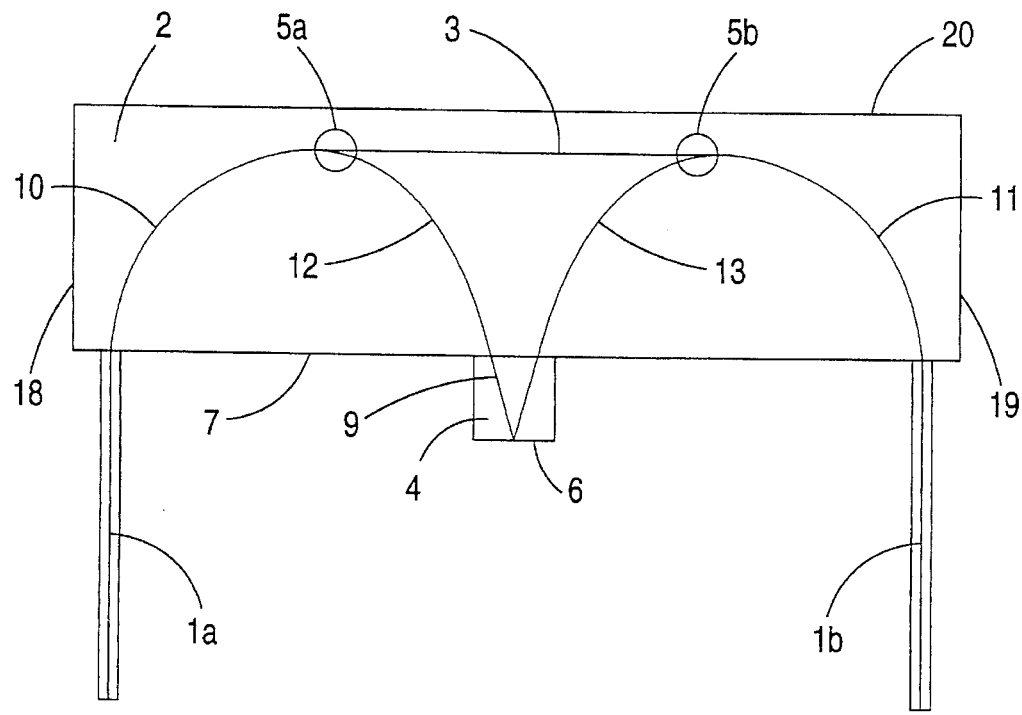
FIG. 4 is a plan view of the optical relay amplifier of a third embodiment of the present invention.

FIG. 4 is a plan view of a third embodiment of the optical relay amplifier of the present invention. In this embodiment, the optical waveguide path circuit on the optical waveguide path circuit substrate 2 is changed in such a manner that the optical fibers 1a, 1b and the semiconductor laser beam amplifier 4 are coupled on the end surface 7 of the optical waveguide path circuit substrate 2. In this embodiment, it is sufficient that only the end surface 7 is optically polished.

Figure 5:
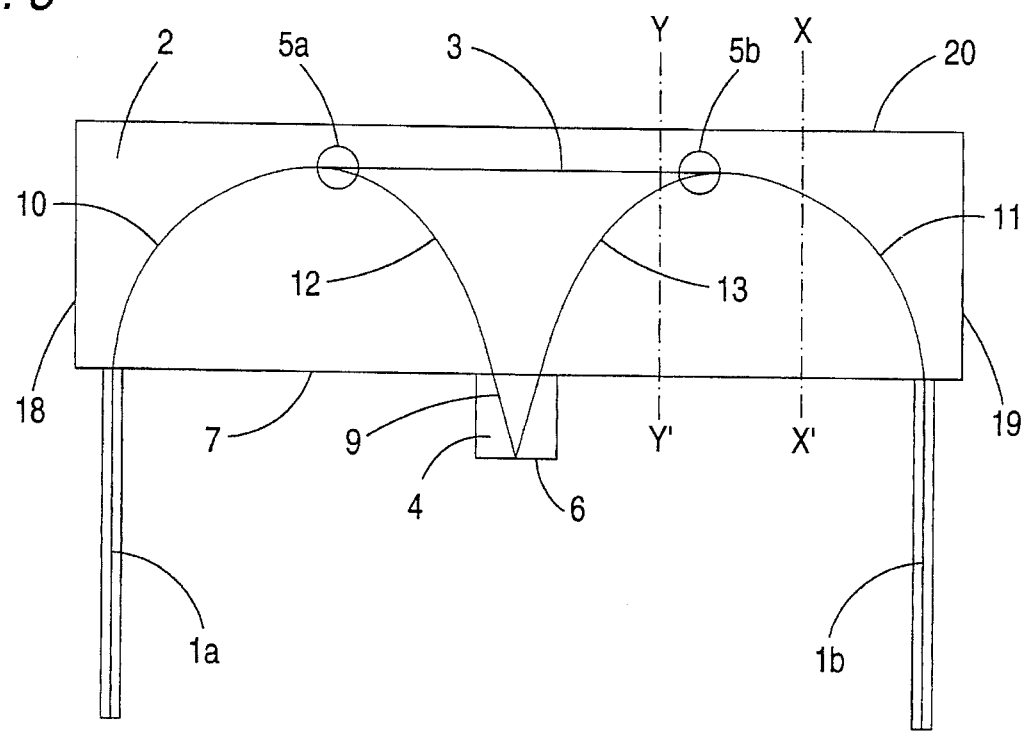
FIG. 5 is a plan view of the optical relay amplifier of a fourth embodiment of the present invention.

FIG. 5 is a plan view of a fourth embodiment of the optical relay amplifier of the present invention. In this embodiment, a multi-layer optical waveguide path is employed for the optical waveguide path circuit substrate 2, so that the present invention is applied to the case of a multi-mode optical waveguide path or optical fiber. It is easy that a stripe width of the semiconductor laser beam amplifier 4 is extended, for example, to about 40 mm, however, it is difficult that the thickness of an active layer is increased to 40 mm. Therefore, it is necessary to devise how the semiconductor laser beam amplifier is applied to the multi-mode optical waveguide path. Concerning this matter, refer to Unexamined Japanese Patent Publication No. 5-7055.

In order to solve the above problems, in this embodiment, a two layer optical waveguide path is employed, and the optical waveguide path is divided in the perpendicular direction of the optical waveguide path circuit substrate 2 so as to form the optical coupler 5a (5b) of this embodiment.

Figure 6A:
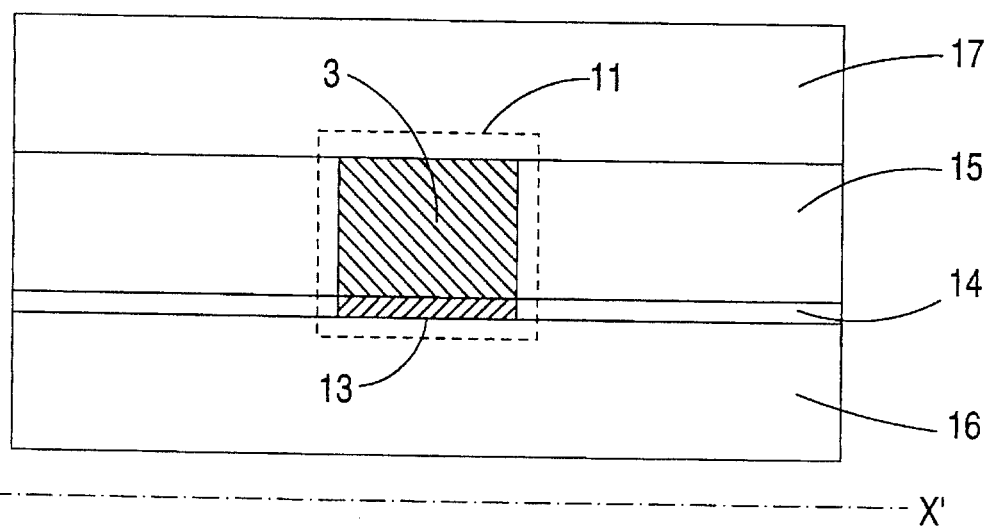
FIG. 6A is a cross sectional view of an optical waveguide path circuit substrate taken on line X—X' in FIG. 5.
Figure 6B:
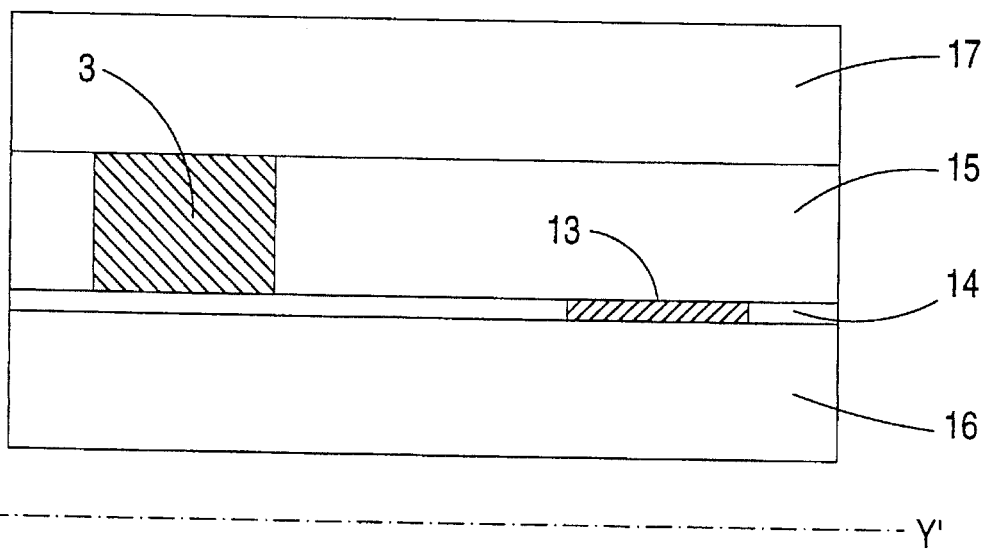
FIG. 6B is a cross sectional view of an optical waveguide path circuit substrate taken on line Y—Y' in FIG. 5.

FIG. 6A is a cross sectional view of the optical waveguide path circuit substrate 2 taken on line X—X' in FIG. 5. FIG. 6B is a cross sectional view of the optical waveguide path circuit substrate 2 taken on line Y—Y' in FIG. 5. On the line X—X', the optical waveguide path (core) 3 and the optical waveguide path (core) 13 overlap each other so as to form the optical waveguide path (core) 11. On the other hand, on the line Y—Y', the optical waveguide path (core) 3 and the optical waveguide path (core) 13 are separate from each other. In this connection, the first substrate 14 and the second substrate 15 are adhered to each other with an optical adhesive agent. Clad layers 16, 17 are respectively adhered onto the first and second substrates 14, 15 with the optical adhesive agent. In this connection, the method of making the optical waveguide path is not limited to the selective optical polymerization method, and further the method of making the optical waveguide path to be a multi-layer is not limited to adhesion. It is possible to use a process of the prior art to which photolithography and reactive ion etching (RIE) are applied. For example, refer to "Development of a Laminated Layer Type Optical Switch by Organic Electrochemical Polymer" by Hikita and Ozawaguchi, Applied Physics, Vol. 63, No. 1, pp 49–52 (1994). Also, refer to Electron. Lett. 27, p 1342 (1991) by S. Imamura, R. Yoshimura, and T. Izawa.

Figure 7A:
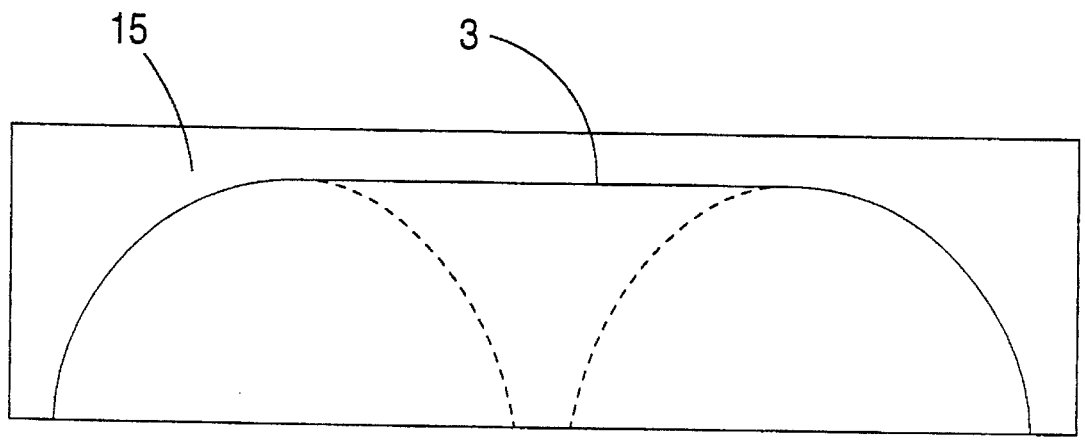
FIG. 7A is a plan view of an optical waveguide path circuit pattern provided on a first substrate.
Figure 7B:
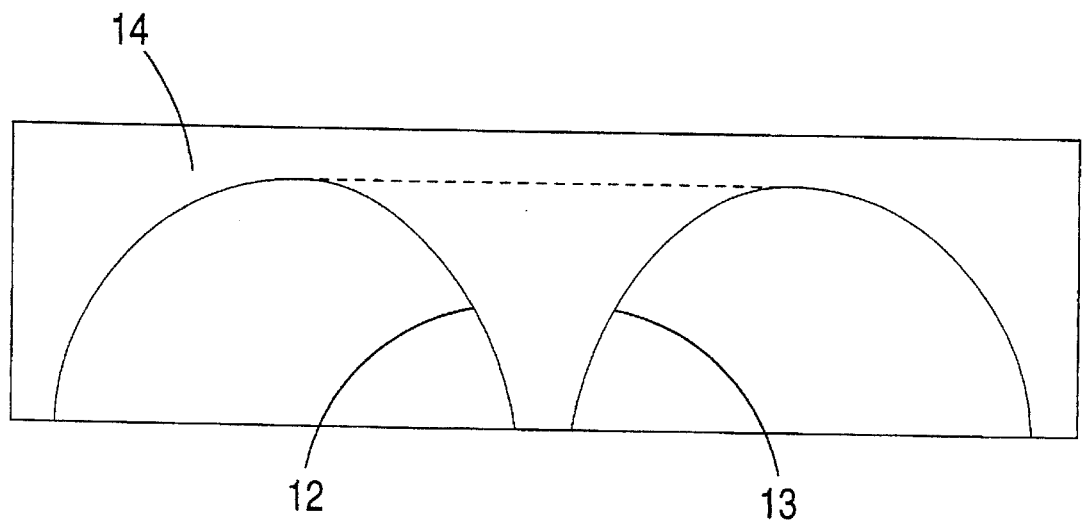
FIG. 7B is a plan view of an optical waveguide path (core) circuit pattern provided on a second substrate.
Figure 9:
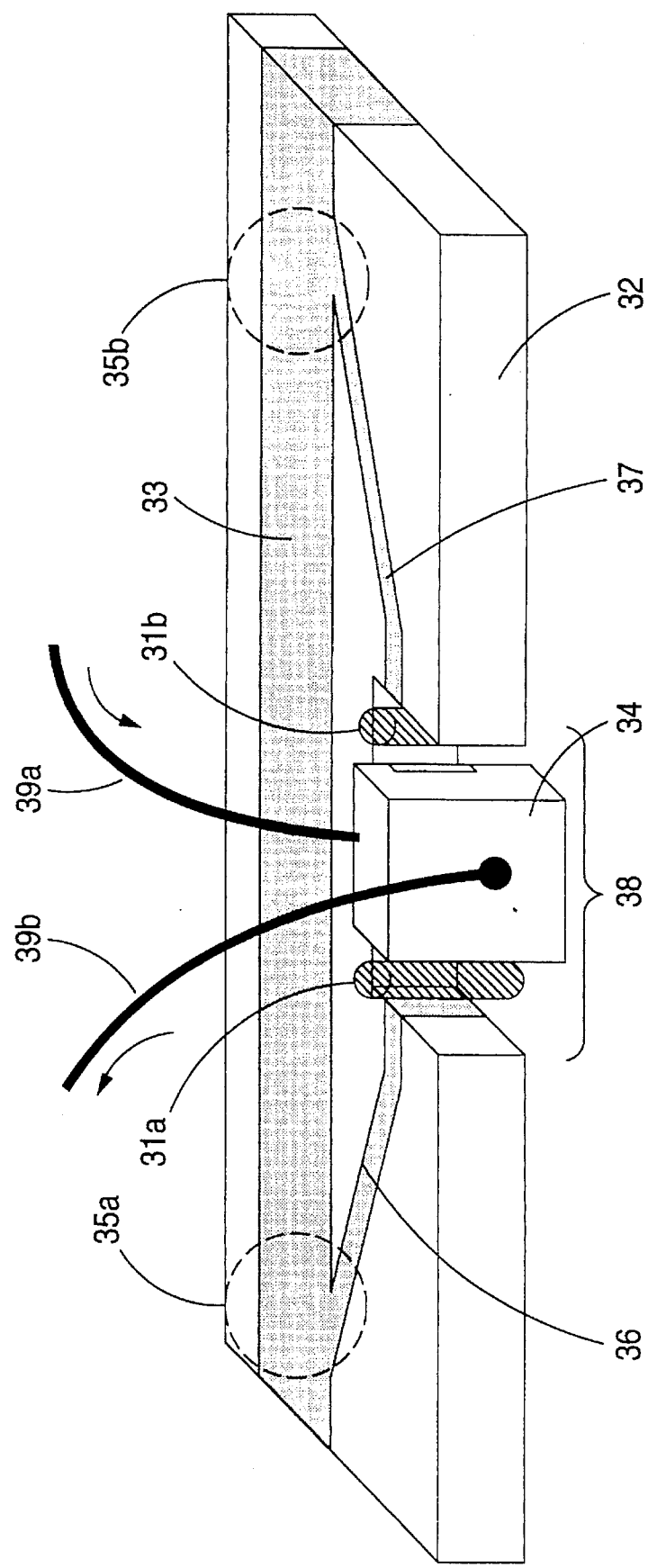
FIG. 9 is a perspective view showing an arrangement of the conventional embodiment.

Different optical waveguide path (core) circuits are respectively provided on the first substrate 14 (on the lower layer side) and the second substrate 15 (on the upper layer side). FIGS. 7A and 7B respectively show optical waveguide path (core) circuit patterns provided on the first and second substrates 14, 15. For example, the thickness of the first substrate 14 is determined to be 4 mm, and the thickness of the second substrate 15 is determined to be 36 mm. Since the optical waveguide path provided on the first substrate 14 of 4 mm thickness is coupled with the semiconductor laser beam amplifier 4, a loss of connection caused between the optical waveguide path circuit substrate 2 and the semiconductor laser beam amplifier is not so large. This concept is basically the same as that of Unexamined Japanese Patent Publication No. 5-7055 described above. In the apparatus disclosed in FIG. 9 of Japanese Unexamined Patent Publication No. 5-7055, a long and thin optical waveguide path is formed in a direction perpendicular to the optical waveguide path circuit substrate 32 and connected with the semiconductor laser beam amplifier 34. On the other hand, in the optical relay amplifier disclosed in this embodiment, a long and thin optical waveguide path is formed in a direction horizontal to the optical waveguide path circuit substrate 2 and coupled with the semiconductor laser beam amplifier 4.

Figure 8:
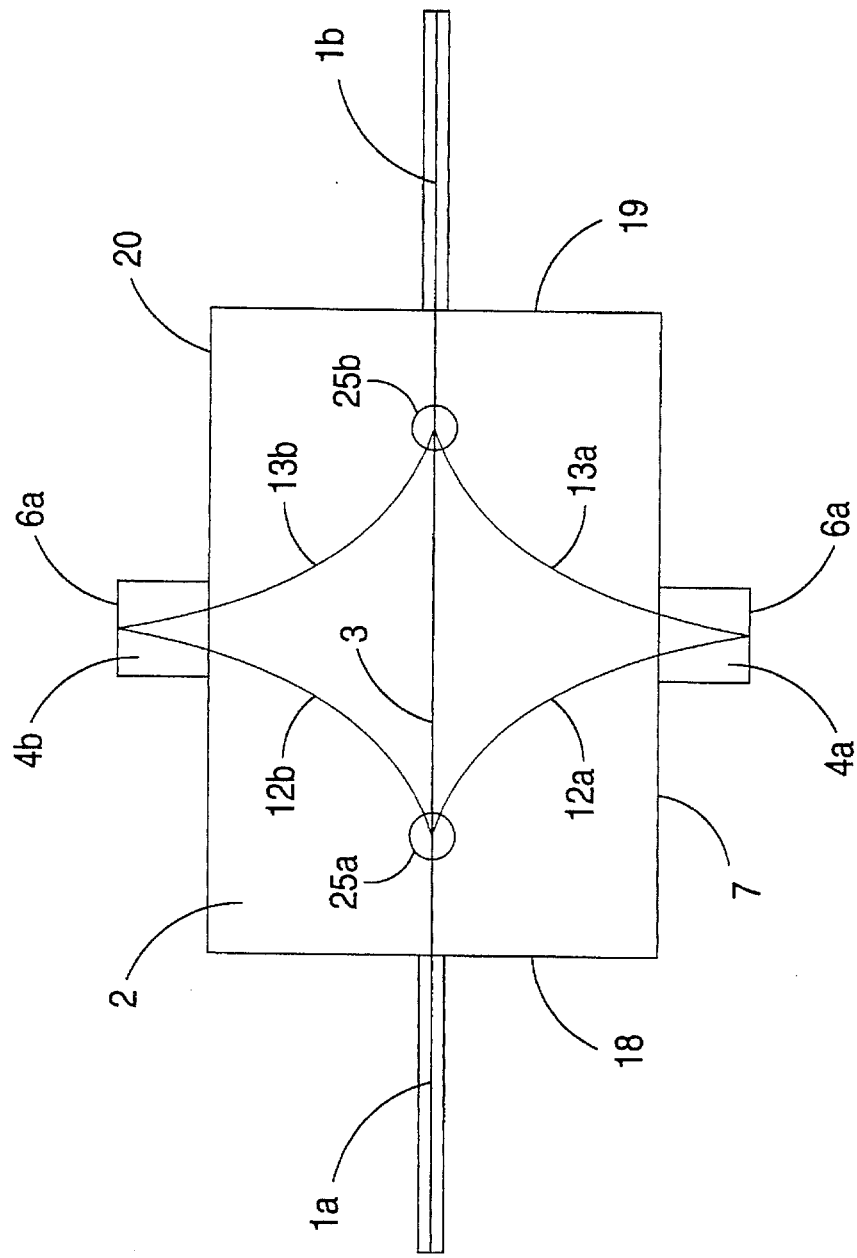
FIG. 8 is a plan view of the optical relay amplifier of the fifth embodiment of the present invention.

FIG. 8 is a plan view of the fifth embodiment of the optical relay amplifier of the present invention. In this embodiment, two semiconductor laser beam amplifiers 4a, 4b are used. A wavelength band capable of being amplified by the semiconductor laser amplifier 4a is different from that capable of being amplified by the semiconductor laser amplifier 4b. Accordingly, a band of wavelength capable of being amplified by the optical relay amplifier can be effectively extended.

Specifically, in the construction of this embodiment, a band gap of the active material layers of respective semiconductor laser amplifiers 4a, 4b are different from each other. For this embodiment, a composition ratio x of the mixed crystal $Al_xGa_{1-x}As$, which is a typical active layer material, of the semiconductor laser amplifier 4a may be different from that of the mixed crystal $Al_xGa_{1-x}As$ of the semiconductor laser amplifier 4b. For example, in the semiconductor laser amplifier 4a, the value x is determined to be x=0, and in the semiconductor laser amplifier 4b, the value x is determined to be x=0.1. Alternatively, the quantum well structure is employed for the active layer, and the width of the quantum well may be changed. It is well known that the effective band gap of an active layer is extended by the effect provided when quanta are confined, when the quantum well width is reduced. Alternatively, the active layer material may be changed to other materials such as AlGaAs alloy and GaInAsP alloy. In this variation, the two semiconductor laser amplifiers 4a, 4b take a share in the amplification, so that the semiconductor laser amplifiers 4a, 4b amplify signals in different wavelength bands. As a result, it is possible to extend the wavelength band to be amplified. Further, since the bypass 3 is shared, the fail-safe property can be maintained high. Since the section of the semiconductor laser amplifier and that of the optical waveguide path are aligned with each other, the connection efficiency can be also maintained high.

Incidentally, in the case of a multi-mode optical waveguide path circuit, it is necessary that the inclination angle q formed between the end surfaces 8 of the optical waveguide paths 9a, 9b of the semiconductor laser amplifier and the perpendicular is larger than the critical angle of the optical waveguide path. It is preferable that the inclination angle q is determined to be 5° to 15°. When this angle is too small, rays of returning light are generated in the reflection on the end surface 6. In the case of a single mode optical waveguide path circuit, it is preferable that the inclination angle q is determined to be 2° to 8° due to the small critical angle. In the structures shown in FIGS. 1, 3, 4, 5 and 8, the optical waveguide paths 10, 11, 12 and 13 are formed to be arcuate. However, it is possible to curve the optical path by an approximately right angle by installing an etched mirror in the optical waveguide path. Although the manufacturing process becomes complicated, an area of the optical waveguide path circuit substrate 2 can be reduced by using the etched mirror.

In the present invention, the end surface of the semiconductor laser amplifier 4 having the V-shaped optical wave guide path 9 is optically coupled with the optical waveguide circuit substrate. Accordingly, it is not necessary to provide a cutout portion on the optical waveguide path circuit substrate. Consequently, it is easy to manufacture the optical waveguide path circuit substrate. Further, it is possible to reduce the number of end surfaces of the optical waveguide path circuit substrate to be optically polished. Also, it is possible to extend the wavelength band of the optical relay amplifier capable of being amplified.

What is claimed is:

1. An optical relay amplifier comprising:

a first optical coupler for dividing inputted signal light into a plurality of lights;

a first optical amplifier which is a semiconductor laser amplifier for amplifying one signal light of said divided plurality of lights, said first optical amplifier including a V-shaped optical waveguide path having two ends and a returning end portion having a reflection surface, one end of said two ends being connected to said first optical coupler;

a bypass optical waveguide path for passing remaining signal light of said divided plurality of lights therethrough; and a second optical coupler for coupling the amplified light from said first optical amplifier with the passing light from said bypass optical waveguide path, the other end of said two ends being connected to said second optical coupler.

2. An optical relay amplifier according to claim 1, wherein an angle of said V-shaped optical waveguide path with respect to a perpendicular of the end surface of the semiconductor laser amplifier is larger than a critical angle of the optical waveguide path of the semiconductor laser amplifier.

3. An optical relay amplifier according to claim 2, wherein said angle of said V-shaped optical waveguide path with respect to a perpendicular of the end surface of the semiconductor laser amplifier is in the range of 2° to 8°.

4. An optical relay amplifier according to claim 2, further comprising an optical waveguide path circuit substrate on which said first and second optical couplers, and said bypass optical waveguide path are formed.

5. An optical relay amplifier according to claim 4, wherein optical fibers connected to said first and second optical couplers are connected on the same one end surface of said optical waveguide path circuit substrate, and said semiconductor laser amplifier is connected on another end surface opposed to said one end surface.

6. An optical relay amplifier according to claim 5, wherein said optical waveguide path circuit substrate comprises a plurality of substrates, said first and second optical couplers, and said bypass optical waveguide path being formed on at least one of said plurality of substrates.

7. An optical relay amplifier according to claim 6, wherein said angle of said V-shaped optical waveguide path with respect to a perpendicular of the end surface of the semiconductor laser amplifier is in the range of 5° to 15°.

8. An optical relay amplifier according to claim 4, wherein optical fibers connected to said first and second optical couplers and said semiconductor laser amplifier are connected on the same one end surface of said optical waveguide path circuit substrate.

9. An optical relay amplifier according to claim 8, wherein said optical waveguide path circuit substrate comprises a plurality of substrates, said first and second optical couplers, and said bypass optical waveguide path being formed on at least one of said plurality of substrates.

10. An optical relay amplifier according to claim 9, wherein said angle of said V-shaped optical waveguide path with respect to a perpendicular of the end surface of the semiconductor laser amplifier is in the range of 5° to 15°.

11. An optical relay amplifier according to claim 1, wherein said semiconductor laser amplifier further includes an electrode which is formed along said V-shaped optical waveguide path.

12. An optical relay amplifier according to claim 1, further comprising an optical waveguide path circuit substrate on which said first and second optical couplers and said bypass optical waveguide path are formed.

13. An optical relay amplifier according to claim 12, wherein optical fibers connected to said first and second optical couplers are connected on the same one end surface of said optical waveguide path circuit substrate, and said semiconductor laser amplifier is connected on another end surface opposed to said one end surface.

14. An optical relay amplifier according to claim 13, wherein said optical waveguide path circuit substrate comprises a plurality of substrates, said first and second optical couplers, and said bypass optical waveguide path being formed on at least one of said plurality of substrates.

15. An optical relay amplifier according to claim 14, wherein an angle of said V-shaped optical waveguide path with respect to a perpendicular of the end surface of the semiconductor laser amplifier is in the range of 5° to 15°.

16. An optical relay amplifier according to claim 12, wherein optical fibers connected to said first and second optical couplers, and said semiconductor laser amplifier are connected on the same one end surface of said optical waveguide path circuit substrate.

17. An optical relay amplifier according to claim 16, wherein said optical waveguide path circuit substrate comprises a plurality of substrates, said first and second optical couplers, and said bypass optical waveguide path being formed on at least one of said plurality of substrates.

18. An optical relay amplifier according to claim 17, wherein an angle of said V-shaped optical waveguide path with respect to a perpendicular of the end surface of the semiconductor laser amplifier is in the range of 5° to 15°.

19. An optical relay amplifier according to claim 1, further comprising a second optical amplifier which is a semiconductor laser amplifier for amplifying one signal light of said divided plurality of lights, said second optical amplifier including a V-shaped optical waveguide path having two ends and a returning end portion having a reflection surface, one end of said two ends being connected to said first optical coupler, the other end of said two ends being connected to said second optical coupler, wherein a wavelength band capable of being amplified by said first optical amplifier is different from that capable of being amplified by said second optical amplifier.

* * * * *